United States Patent [19]

Fujiyama

[11] Patent Number: 4,732,792

[45] Date of Patent: Mar. 22, 1988

[54] METHOD FOR TREATING SURFACE OF CONSTRUCTION MATERIAL FOR VACUUM APPARATUS, AND THE MATERIAL TREATED THEREBY AND VACUUM TREATMENT APPARATUS HAVING THE TREATED MATERIAL

[75] Inventor: Yasutomo Fujiyama, Tokyo, Japan

[73] Assignee: Canon Kabushiki Kaisha, Tokyo, Japan

[21] Appl. No.: 783,478

[22] Filed: Oct. 3, 1985

[30] Foreign Application Priority Data

Oct. 8, 1984 [JP] Japan .................. 59-210792

[51] Int. Cl.$^4$ .................. B05D 1/08; B05D 1/10
[52] U.S. Cl. .................. 427/423; 118/50; 118/50.1; 118/724; 427/295
[58] Field of Search .................. 219/544, 534, 275; 338/238, 239, 240, 241, 242; 118/724, 50.1, 50; 427/94, 423, 295

[56] References Cited

U.S. PATENT DOCUMENTS

| | | | |
|---|---|---|---|
| 2,036,788 | 4/1936 | Abbott | 338/238 |
| 2,331,093 | 10/1943 | Holand | 338/242 |
| 2,767,288 | 10/1956 | Lennox | 338/238 |
| 2,858,401 | 10/1958 | Andrews | 338/239 |
| 2,988,807 | 6/1961 | Boggs | 427/423 X |
| 3,226,806 | 1/1966 | Gatewood | 427/423 |
| 3,369,209 | 2/1968 | Edwin et al. | 338/238 X |
| 4,428,975 | 1/1984 | Dahm et al. | 427/94 |
| 4,499,354 | 2/1985 | Hill et al. | 118/50.1 |
| 4,526,644 | 7/1985 | Fujiyama et al. | 118/50.1 |
| 4,620,086 | 10/1986 | Ades et al. | 427/423 |

*Primary Examiner*—Shrive P. Beck
*Attorney, Agent, or Firm*—Fitzpatrick, Cella, Harper & Scinto

[57] ABSTRACT

The surface of an element of a vacuum apparatus is coated with a film formed by a flame spraying method.

32 Claims, 14 Drawing Figures

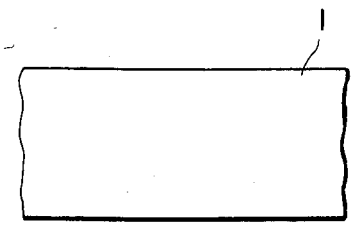
FIG. IA
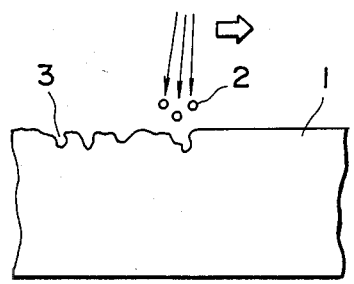
FIG. IB
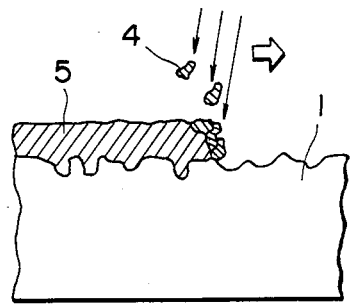
FIG. IC

METHOD FOR TREATING SURFACE OF CONSTRUCTION MATERIAL FOR VACUUM APPARATUS, AND THE MATERIAL TREATED THEREBY AND VACUUM TREATMENT APPARATUS HAVING THE TREATED MATERIAL

BACKGROUND OF THE INVENTION

1. Field of the Invention

This invention relates to a surface treating method for treating an internal wall and internal elements of a vacuum apparatus in which processing and treatment are performed under vacuum atmosphere, particularly, a vacuum treatment apparatus in which a thin film of a dielectric, a semiconductor, or the like is applied to the surface of a substrate by a vapor deposition method in a vacuum processing apparatus in which etching or the like is performed. Further, it relates to the construction material for the vacuum apparatus the surface of which is treated by said surface treating method and to the vacuum treatment apparatus made from the treated material. As used herein, the term 'construction material' refers to an element of a vacuum apparatus.

2. Description of the Prior Art

As a construction material for a vacuum apparatus, a material having a surface which is chemically and thermally stable and which releases gas as little as possible under vacuum is desired. Also, a material constituting a vacuum chamber is required to have sufficient mechanical strength to withstand high pressure.

Therefore, the construction materials employed in the conventional apparatuses have been generally stainless steel or steel electroplated with nickel. However, they have had a defect that a large quantity of the gas is released under vacuum. Further, vacuum processing apparatuses using an etching gas such as $CF_4$ and the like have had a problem in the corrosion resistance of the materials.

For this reason, for example, an aluminum material which releases little gas as compared with the above metal materials, and further, which is excellent in corrosion resistance to the above etching gas has been used as a construction material or coating material in recent years.

In the case of using an aluminum material as a construction material for a vacuum apparatus, the construction material is cut from a block material of aluminum, and in the case of using an aluminum material as a coating material, the aluminum film is coated by a vapor deposition method on the surface of the construction material such as stainless steel and the like.

However, the former has the disadvantage, for example, that it is necessary to make the chamber wall thicker from a standpoint of mechanical strength in the case of a large-sized vacuum chamber. The latter is limited in the size and shape of a construction material that can be coated by the vapor deposition, and in thickness of aluminum film that can be vapor-deposited.

Further, the latter method has the following problems.

(1) The productivity is poor since the vacuum apparatus must be used in the method and it takes a long time to exhaust the gas in the apparatus.

(2) In the case where the construction material for the vacuum apparatus to be treated by the vapor deposition is large, the productivity becomes even poorer since a large-sized vacuum apparatus is necessarily required.

(3) In the case where the above construction material for the vacuum apparatus has a complex shape, a complicated operation is required to form a vapor deposition film having a uniform film thickness over each part.

SUMMARY OF THE INVENTION

An object of the present invention is to provide a method for treating the surface of a construction material for a vacuum apparatus for improving its exhaust characteristics without obstructing the manufacture and its process of the conventional vacuum apparatus, and relates to the construction material for the vacuum apparatus the surface of which is treated by the surface treating method and to a vacuum treatment apparatus made of the treated material.

Another object of the present invention is to provide a method for treating the surface of a construction material for a vacuum apparatus for improving its corrosion resistance during a vacuum processing treatment, and relates to the construction material for the vacuum apparatus the surface of which is treated by the surface treating method and to a vacuum treatment apparatus made of the treated material.

According to one aspect of the present invention, there is provided a method for treating the surface of a construction material for a vacuum apparatus in which processing and treatment are performed under vacuum atmosphere, which comprises forming a film on the surface of the construction material by a flame spraying method.

According to another aspect of the present invention, there is provided a construction material for vacuum apparatus in which a processing and treatment are performed under a vacuum atmosphere, characterized in that a film is formed on the surface of the above material by a flame spraying method.

According to a further aspect of the present invention, there is provided a vacuum treatment apparatus having a construction material treated as described above.

BRIEF DESCRIPTION OF THE DRAWING

FIG. 1A–FIG. 1C show schematically cross-sectional views of a construction material in each step of a flame spraying treatment according to the present invention;

DETAILED DESCRIPTION OF THE PREFERRED EMBODIMENTS

Figure 2A:
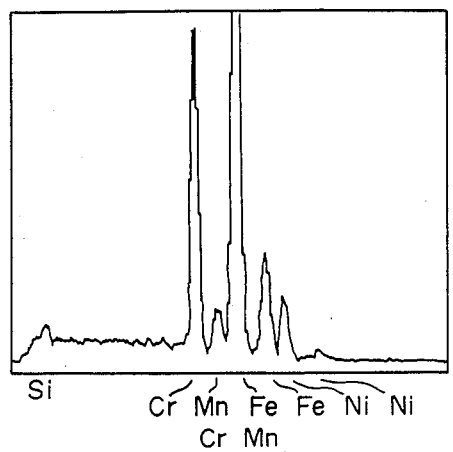
FIG. 2A–FIG. 2C show the analytical results of constituent elements of stainless steel and pure aluminum plate used as a construction material for a vacuum apparatus and the Al flame spraying film according to the present invention, respectively, by an energy dispersion type X-ray analyzer.

The flame spraying method in the present invention comprises thermally-melting a flame spraying material under, for example, the gas plasma atmosphere of $H_2$, Ar, He or the like, or the flame of a flammable gas such as $H_2$ and the like, and then spraying the above-melted material on the surface of the construction material.

The construction material for a vacuum apparatus of the present invention may be generally a steel such as stainless steel and the like. However, other materials having sufficient strength may be used.

The film formed on the surface of the construction material by the flame spraying is preferably composed of aluminum which releases little gas under vacuum. On this occasion, in the case where the surface of the construction material for the vacuum apparatus is required to have conductivity, a film can be composed of metallic aluminum, and in the case of nonconductivity, a film composed of an oxide of aluminum can be formed with aluminum as the flame spraying material under an oxygen-containing gas atmosphere. Also, in the latter case, a film composed of an oxide of silicon may be formed. The above film composed of an oxide of aluminum may be formed with a ceramic of alumina ($Al_2O_3$) as the flame spraying material.

As the construction material for the vacuum apparatus, there may be mentioned, for example, a heater, a cathode electrode, a substrate holder, a rotation mechanism of a substrate holder, a gas-releasing pipe, a baffle plate, a shield plate or the like.

In the case where the film is formed by the flame spraying method according to the present invention, the adhesiveness of the film can be strengthened by suitably making uneven the surface of the construction material for the vacuum apparatus to be covered with the film.

Thus, in the case where the above surface is even, it is desired to make the surface uneven by a blast treatment prior to the formation of the film by the flame spraying method.

Hereinafter, the present invention is illustrated by referring to the figures.

FIG. 1A–FIG. 1C show schematically cross-sectional views of a construction material in each step of the flame spraying treatment according to the present invention.

FIG. 1A is a cross-sectional view of the construction material prior to the flame spraying treatment, and 1 in this figure shows a steel such as stainless steel and the like.

FIG. 1B is a construction material during a blast treatment, and 2 is this figure shows a blast material composed of a ceramic particle or the like. The surface is made uneven by blasting the blast material to the surface of the construction material at a high speed utilizing air pressure and water pressure. 3 shows the surface of the construction material subjected to the blast treatment.

FIG. 1C shows the state in which aluminum is being sprayed on the surface of the construction material by the flame spraying. 4 in this figure shows an aluminum particle which has been thermally-melted in plasma (or in gas flame) and is being sprayed utilizing gas ($H_2$, Ar, $N_2$) pressure. In the case of the film composed of an oxide of aluminum, the film may be formed under an oxygen-containing gas atmosphere. The aluminum particles fill in the hollows of the uneven surface of the construction material, and further, are deposited on its surface to coat the surface of the construction material. Thereby, the aluminum film is formed on the surface. 5 shows a film composed of aluminum (hereinafter referred to as "flame spraying film"). The flame spraying film strongly adheres mechanically on the surface of the construction material having the hollow as anchor.

Figure 2B:
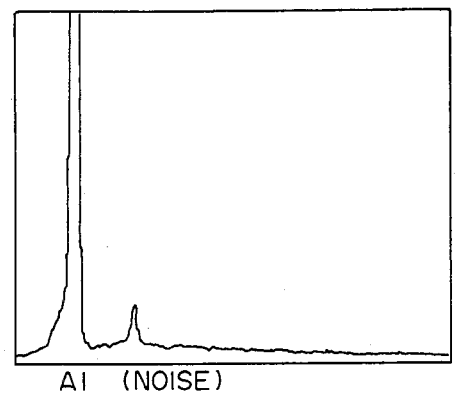
Figure 2C:
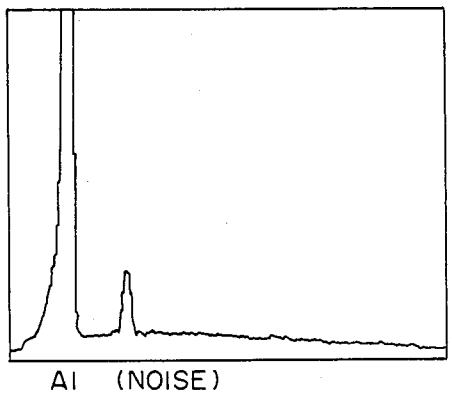

FIG. 2A–FIG. 2C show analytical results of the constituent elements of stainless steel and a pure aluminum plate used as the construction material for the conventional vacuum apparatus and the Al flame spraying film according to the present invention by an energy dispersion type X-ray analyzer (X-ray micro analyzer; hereinafter abbreviated as XMA).

FIG. 2A shows an analytical result of stainless still, i.e., JIS-SUS304 (hereinafter referred to as "SUS304 steel"), which has been used as the construction material of the conventional vacuum apparatus, by XMA. In this figure, the abscissa shows the elements contained in the construction material and the ordinate shows intensity proportional to the content of each element. SUS304 steel used as the sample contains chromium (Cr), nickel (Ni), manganese (Mn), silicon (Si), and iron (Fe) in the proportion as follows according to JIS.

Cr=20–18 wt.%;
Ni=8–10 wt.%;
Mn≦2 wt.%;
Si≦1 wt.%; and
Fe (balance):

The result of the XMA analysis corresponds well thereto and the contained elements can be determined on the order of percent.

FIG. 2B shows an analytical result of a pure aluminum plate (trade name: Super Luster) by XMA. The result shows that no elements except aluminum were detected and the aluminum has a purity of about 99% or more.

FIG. 2C is an XMA analytical result of the sample in which a highly pure aluminum film (99.99%) is formed on the surface of the above-mentioned SuS304 steel by the plasma flame spraying under reduction gas, i.e., hydrogen atmosphere.

A thickness of the Al flame spraying film was about 200-300 μm and the surface of the SUS304 substrate was subjected to the blast treatment prior to the flame spraying.

The XMA analytical result of the Al flame spraying film (that is, X-ray is irradiated to the Al flame spraying film side) shows that 99% or more of Al was contained similarly to the aluminum plate in FIG. 2B.

That is, it was found from the analysis that the surface of the SUS304 steel as a base material had been coated completely with the pure Al flame spraying film.

Figure 3:
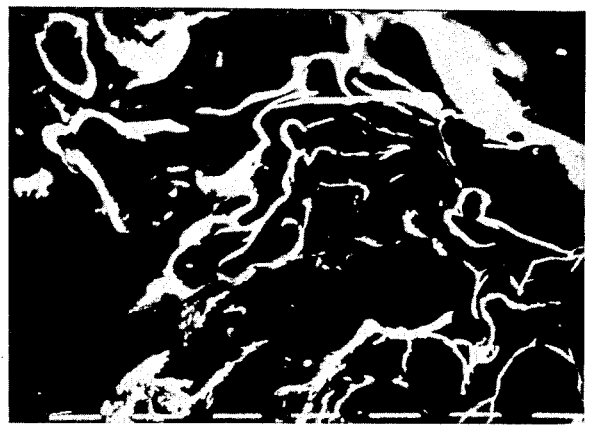
FIG. 3 shows an electron micrograph of the metal structure of the Al flame spraying film surface according to the present invention.

FIG. 3 shows an electron micrograph of the metal structure of the Al flame spraying film surface according to the present invention, and each of white lines in the electron micrograph corresponds to 10 μm in size.

The Al particle of about 30 μm had adhered onto the surface of the Al flame spraying film. However, the internal part of the flame spraying film had a fine structure.

From the analytical result as described above, it was found that the surface of SUS304 steel was coated completely and easily with the Al film by subjecting the surface of SUS304 steel used in the conventional vacuum apparatus to the flame spraying treatment under reduction gas, i.e., hydrogen atmosphere.

Figure 4:
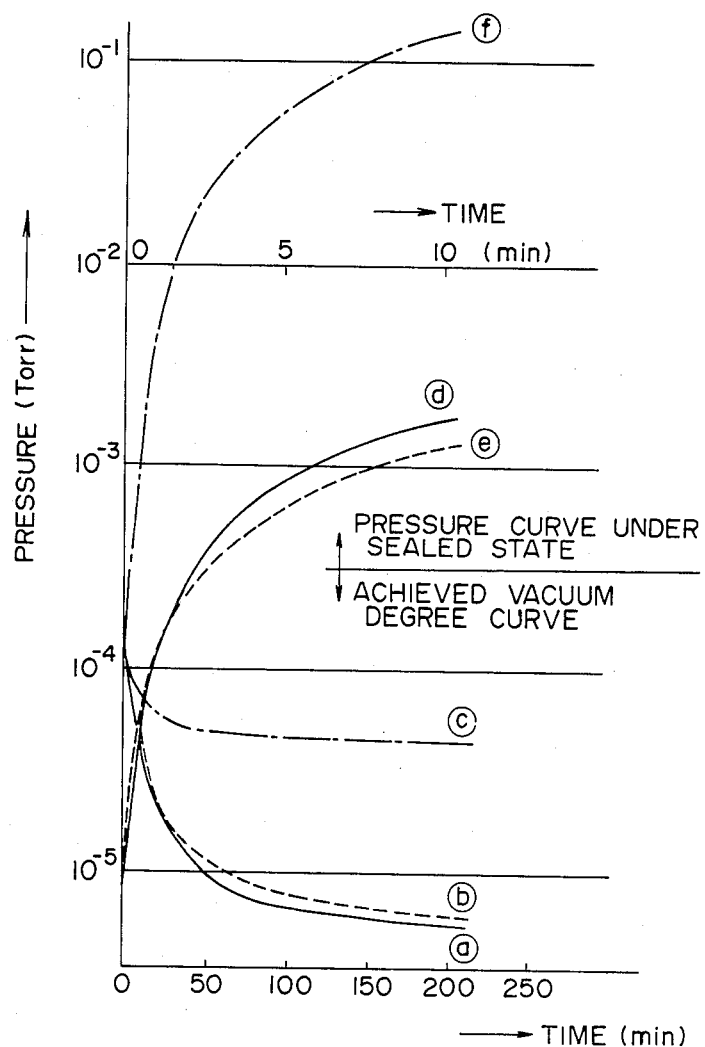
FIG. 4 is a graph, for comparison, showing the achieved vacuum degree curves and the pressure curves under sealed state measured in a vacuum apparatus in which a test material is not set, a vacuum apparatus in which stainless steel having the Al flame spraying film according to the present invention is set and the vacuum apparatus in which stainless steel not having the Al flame spraying film is set.

FIG. 4 is a graph showing the achieved vacuum degree curves and the pressure curves under sealed state measured in the vacuum apparatus in which the test material is not set, the vacuum apparatus in which stainless steel having the Al flame spraying film according to the present invention is set, and the vaccum apparatus in which stainless steel not having the Al flame spraying film is set.

Used for the measurement was a cylindrical vacuum chamber made of SUS304 steel which has a 260 mm inside diameter and 120 mm height. This chamber was evacuated to vacuum by an evacuation system in which an oil diffusion pump having the evacuation rate of 135 l/s and an oil-sealed rotary vacuum pump having that of 5.3 l/s are connected directly.

Curve ⓐ in FIG. 4 shows the achieved vacuum degree curve of the vacuum apparatus. In this figure, the abscissa shows time (minute) and the ordinate shows the pressure (Torr).

Curve ⓑ shows the achieved vacuum degree curve in the case where six of 10 cm by 10 cm by 1 mm SUS304 steel plates the surface of which was coated with the Al plasma flame spraying film, are set in the vacuum chamber.

The SUS304 steel plates used for the measurement were set after the both surfaces were treated by the Al flame spraying and cleaned with acetone.

Curve ⓒ shows the achieved vacuum degree curve in the case where six of the 10 cm by 10 cm by 1 mm SUS304 steel plates the surface of which was not treated by the Al flame spraying are set in the vacuum chamber. The SUS304 steel plates were cleaned with pure water after the liquid honing with glass beads, treated by the baking under atmospheric pressure at 150° C., and set in the vacuum chamber.

The achieved vacuum degree P (Pa) of the vacuum apparatus is represented by the following expression in the case where the vacuum chamber having the surface area A (m²) is evacuated by the evacuating apparatus having the evacuation rate S (l/s), q (w/m²) is the releasing quantity of the adsorbed gas from the internal wall and internal parts of the vacuum chamber, and Q (w/m²) is the leak quantity of the vacuum chamber.

$$P = 1000 \cdot \frac{(q + Q) \cdot A}{S} \quad (1)$$

Each of the releasing quantity of the adsorbed gas were calculated as follows from each of the achieved vacuum degree curve in FIG. 4 by fitting the expression (1).

(1) Curve ⓐ: $(q_0+Q)=3.91\times10^{-4}$ w/m²;
(2) Curve ⓑ: $(q_0+Q)+q_1=2.86\times10^{-4}$ w/m²; and
(3) Curve ⓒ: $(q_0+Q)+q_2=2.18\times10^{-1}$ w/m²;

wherein $q_0$ is the releasing quantity of the adsorbed gas from the internal wall of the vacuum chamber;

$q_1$ is the releasing quantity of the adsorbed gas from the SUS304 steel plate subjected to the Al flame spraying treatment; and $q_2$ is the releasing quantity of the adsorbed gas from the SUS304 steel plate not subjected to the Al flame spraying treatment.

Curve ⓓ in FIG. 4 is the pressure curve under sealed state obtained by measuring the change in vacuum degree resulting from both the releasing of the adsorbed gas from the wall and the leak from the vacuum chamber in the case where no test material was set in the vacuum chamber and the evacuation valve was closed after the lapse of a desired time after the evacuation.

Curve ⓔ is the pressure curve under sealed state obtained under the condition as described above in the case where the SUS304 steel plate subjected to the Al flame spraying treatment was set in the vacuum chamber. Curve ⓕ is the pressure curve under sealed state obtained under the condition as described above in the case where the SUS304 steel plate not subjected to the Al flame spraying treatment was set in the vacuum chamber.

The releasing quantity of the absorbed gas calculated previously corresponds well to the pressure curve under sealed state. That is, the SUS304 steel plate subjected to the pure Al flame spraying treatment releases little of absorbed gas under vacuum and causes only a small change in the internal pressure of the vacuum chamber under sealed state. The SUS304 steel plate not subjected to the flame spraying released much quantity gas and the change in the internal pressure became extremely large.

However, the quantity of released gas in the case where the SUS304 steel plate subjected to the pure Al flame spraying was set in the vacuum chamber was less than that in the case where no test material was set in the vacuum chamber because the vacuum seal of the opening for the sample was imperfect, thereby the leak quantity Q of the vacuum chamber increased.

From the results as described above, it was found that there could be obtained a construction material for vacuum apparatus from which the quantity of the absorbed gas released is extremely little under vacuum, and which has characteristics similar to that of the conventional SUS304 steel (that is, the SUS304 not subjected to the Al flame spraying treatment) concerning mechanical strength and the processing.

In the present invention, as the material of the flame spraying film coating the construction material of the vacuum apparatus in which a fluorine compound gas such as $CF_4$ and the like is used., aluminum or the oxide of aluminum may be used from the standpoint of corrosion resistance.

Thus, the corrosion resistance of the vacuum apparatus can be improved and the range of uses of the apparatus can be enlarged by forming the flame spraying film composed of aluminum or an oxide of aluminum on the surface of the construction material for the vacuum apparatus.

As the construction material for the vacuum apparatus having corrosion resistance, an aluminum material has been usually used. However, aluminum material can be used for the vacuum chamber or the like which requires mechanical strength, only to a limited range.

In the present invention, the vacuum chamber composed of the construction material for the vacuum apparatus having improved anticorrosion may be easily formed by fabricating a base material of the vacuum chamber with, for example, SUS 304 steel and coating the internal wall with the flame spraying film composed of aluminum or an oxide of aluminum.

Also, anticorrosion of internal parts of the vacuum apparatus, particularly, the internal parts subjected to the plasma atmosphere in the vacuum chamber can be easily improved by forming the flame spraying film composed of aluminum or an oxide of aluminum on the surface of the internal parts.

Further, the surface treatment in which the flame spraying film composed of aluminum or an oxide of aluminum is coated on the surface of the construction material or the like can be also applied to the surface treatment of a member having a high degree of thermal deformation, for example, a heater for the vacuum apparatus which is one of the construction materials for the vacuum apparatus and which is coated generally with SUS 304 steel. Thereby, during heating, the releasing quantity of the absorbed gas from the surface in this case can be made extremely less than that in the case of the conventional type where SUS 304 steel is used.

This invention can be used for improving the corrosion resistance of the heater for the vacuum apparatus in which an etching gas such as $CF_4$ and the like is used for etching.

In the following, there is described in detail a heater for the vacuum apparatus which is one of the construction materials for the vacuum apparatus according to the present invention.

Since the heater itself is heated to a high temperature in the vacuum apparatus, it is required to be thermally stable.

Also, it is desired that the heater for the vacuum apparatus releases as little gas from its surface as possible for improving the evacuation characteristics of the vacuum apparatus, in a manner similar to other internal parts employed in the vacuum apparatus.

Further, since an etching gas such as a fluorine type gas and the like is used in the case where a substrate is treated by dry etching in the vacuum apparatus, the heater for the vacuum apparatus should have corrosion resistance to the above etching gas.

Figure 5:
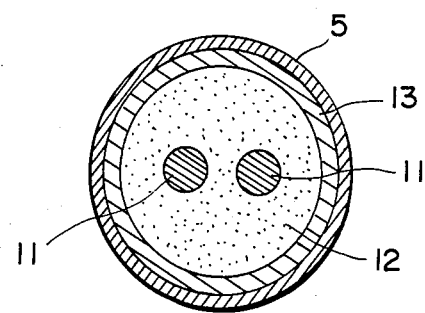
FIG. 5 shows schematically a cross-sectional view of an example of a heater for the vacuum apparatus having the Al flame spraying film, which is one of the construction materials for the vacuum apparatus according to the present invention.

FIG. 5 shows schematically a cross sectional view of an example of the heater for the vacuum apparatus having the Al flame spraying film which is one of the construction materials for the vacuum apparatus according to the present invention. 11 is a heating wire composed of nichrome, and electrical power is supplied thereto from the exterior to transform the electric energy into thermal energy. 12 denotes insulating powder composed of magnesia (MgO). This powder prevents short circuits resulting from contact between the heating wires 11 and contact between the heating wire 11 and a protecting tube 13 composed of, for example, a metal such as stainless steel, and transmits efficiently heat generated in the heating wire 11 to the protecting tube 13. The protecting tube 13 supports and protects the heating wire 11 and the insulating powder 12, and serves to divide the inside thereof being at atmospheric pressure from the outside thereof being vacuum. Thus the protecting tube 13 requires a proper degree of mechanical strength.

The connecting portion of the vacuum chamber with the tube 13 is completely sealed up for maintaining vacuum in the vacuum chamber. The portecting tube 13 has a 2.3 mm inside diameter and a 3.3 mm outside diameter. 5 shows a flame spraying film formed by the flame spraying method and applied to the surface of the protecting tube 3. The flame spraying film 5 is composed of aluminum of 99% or more in purity and the thickness is 500 $\mu$m.

This film 5 is formed by thermally-melting aluminum of high purity (99.99%) under a plasma atmosphere of argon gas and spraying the melted aluminum on the surface of the heater at near-sonic speeds utilizing a gas pressure of 150 kg/cm$^2$ under a hydrogen reduction atmosphere. The flame spraying film 5 adheres mechanically more strongly to the surface of protecting tube 13 having an uneven surface, serving as anchor, formed by blast treatment prior to the flame spraying treatment.

Figure 6A:
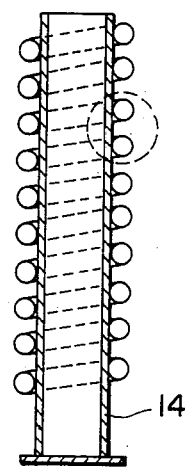
FIG. 6A shows schematically a cross-sectional view of a heater for the vacuum apparatus prior to the Al flame spraying treatment constructed so as to heat a cylindrical substrate from the inside thereof.
Figure 6B:
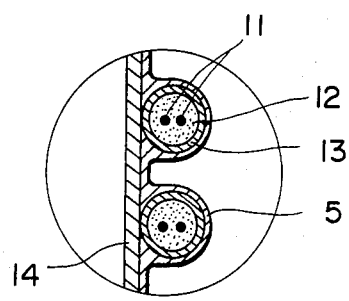
FIG. 6B shows schematically an enlarged cross-sectional view of the portion encircled with the broken line of the heater shown in FIG. 6A treated by the Al flame spraying.

FIG. 6A shows schematically a cross sectional view of a heater for the vacuum apparatus prior to the Al flame spraying treatment constructed so as to heat a cylindrical substrate from the inside thereof. FIG. 6B shows schematically a enlarged cross sectional view of the portion encircled with a broken line of the heater shown in FIG. 6A treated by the Al flame spraying.

11, 12, 13 and 5 in this figure correspond to the respective parts of the heater for the vacuum apparatus according to the present invention shown in FIG. 5. That is, 11 is a heating wire composed of nichrome, 12 is insulating powder composed of magnesia (MgO), 13 is a protecting tube composed of stainless steel (JIS-SUS 304 steel), and 5 is a flame spraying film formed by the flame spraying method. 14 is a support for the heater for which a pipe (40 mm outside diameter) composed of stainless steel having a 1 mm thickness was employed for making the heat capacity smaller and making the thermal response property better.

The heater for the vacuum apparatus shown in FIG. 6 was manufactured by winding and fixing round the support 14 for the heater the protecting tube 13 in which the heating wire 11 and the insulating powder 12 are contained thermally-melting aluminum of high purity (99.99%) under a plasma atmosphere of argon gas, and spraying the melted aluminum to the support 14 for the heater on which the above protective tube 13 is wound under a hydrogen reducing atmosphere.

The flame spraying film 5 formed according to the above procedure is composed of aluminum of purity of 99% or more and has about 1 mm in average thickness, and this film 5 coated completely the surface of protecting tube 13 and support 14 for the heater.

A film composed of aluminum oxide may be formed by spraying the melted aluminum under air or oxygen atmosphere in place of a hydrogen reducing atmosphere.

Further, since the protecting tube 13 has a proper workability, the pitch of tube 13 wound round support 14 for the heater can be optionally changed. Thereby, distribution of temperature in the axial direction of the cylindrical substrate can be regulated.

The releasing quantity of the gas from the heater for the vacuum apparatus (hereinafter referred to as "aluminum flame spraying heater") as shown in FIG. 6 according to the present invention was compared with that from a heater for the vacuum apparatus not having an Al flame spaying film 5, but having a stainless steel surface only (hereinafter referred to as "stainless steel heater") of the same structure as that in FIG. 6.

In the above comparative experiment, a coaxial cylinder plasma CVD apparatus was used.

The above apparatus has the following structure:
(1) A cylindrical heater being set at the center of the apparatus;
(2) A rotative cylindrical substrate composed of aluminum as an anode being set so as to hide the heater of (1);
(3) A cathode composed of aluminum serving as the wall of the vacuum chamber being set outside the substrate of (2):

First, the aluminum flame spraying heater was set in the above experimental apparatus and evacuation was performed for 200 minutes at room temperature by a vacuum evacuation pump set outside the above apparatus. The inside of the apparatus was heated by supplying electric power to the above heater such that the heater surface temperature is raised to 500° C. and the substrate surface temperature to 300° C., and then the evacuation characteristics of the experimental apparatus was measured.

Next, as to the above stainless steel heater, an experiment was carried out according to the same procedure as the above, and the evacuation characteristics of the apparatus provided with the stainless steel heater were measured.

Figure 7:
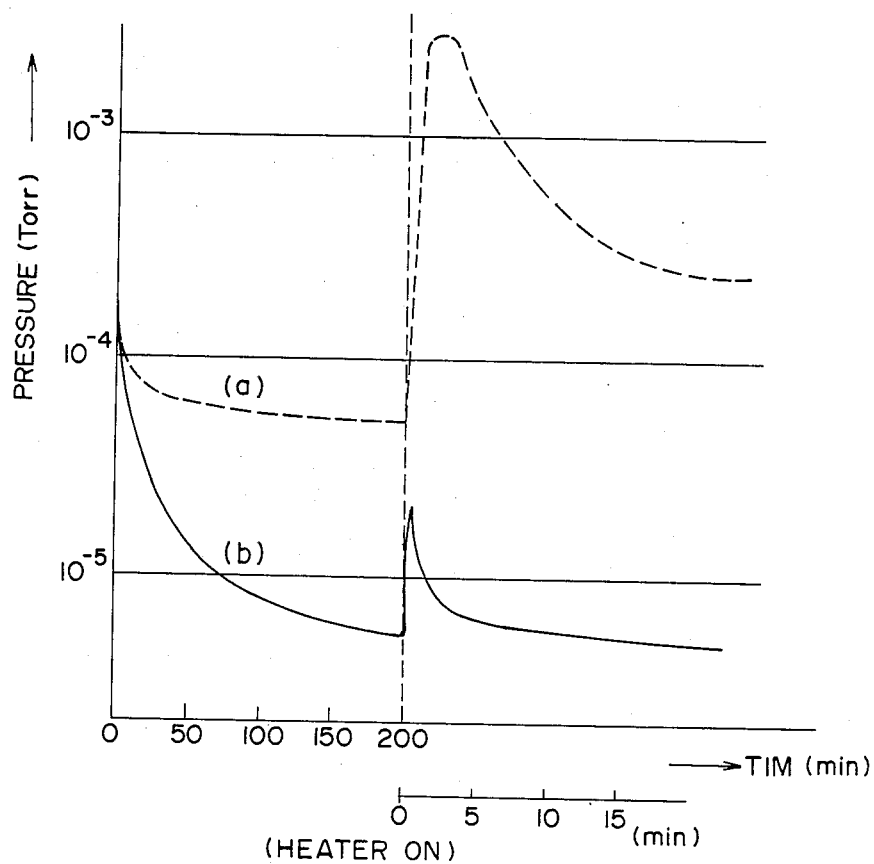
FIG. 7 shows an evacuation curve of an experimental vacuum apparatus having a heater treated by the Al flame spraying and an evacuation curve of an experimental vacuum apparatus having a heater composed of stainless steel not treated by the Al flame spraying having the shape as shown in FIG. 6.

FIG. 7 shows an evacuation curve of an experimental vacuum apparatus having an aluminum flame spraying heater and an evacuation curve of an experimental vacuum apparatus having a stainless steel heater having the shape as shown in FIG. 6.

A in FIG. 7 shows an evacuation characteristic curve of the apparatus in which the stainless steel heater was set and B shows an evacuation characteristic curve of the apparatus in which an aluminum flame spraying heater was set.

Since apparatuses are not different from each other in the construction other than the heater, it appears that the difference between the evacuation characteristic curves (a) and (b) results from the difference in the quantity of gas released from the surface of the heater.

The experimental apparatus in which the aluminum flame spraying heater has been set has very good evacuation characteristics as compared with that in which the stainless steel heater has been set. That is, the achieved vacuum degree at room temperature is higher, the quantity of the absorbed gas released during heating of the heater is less, the achieved vacuum degree during heating of the heater is also higher, and the vacuum degree, lowered once by heating the heater, returns to the high vacuum state in a short time.

Using the experimental apparatus in which the aluminum flame spraying heater has been set and that in which the stainless steel heater has been set, to the corrosion resistance of the heaters was investigated by repeating alternately dry etching employing carbon tetrafluoride ($CF_4$) gas and a vapor deposition of a semiconductor film of amorphous silicon employing silane gas as a raw material according to a high frequency plasma CVD method (13.56 MHz).

In the case of the vapor deposition of amorphous silicon, the heaters were heated to 550° C. (substrate temperature of 300° C.) for 4 hours and in the case of the dry etching, supply of electric power to the heaters was stopped and the heaters were cooled on standing for 2 hours.

Corrosion of the stainless steel heater which proceeded from the first dry etching made it impossible to use the heater.

On the other hand, the aluminum flame spraying heater was not affected by the first heating other than by a little alteration in the metallic luster of the aluminum surface. Further, after the above heating was repeated 20 times or more, the heating ability and external appearance thereof were not affected.

Figure 8A:
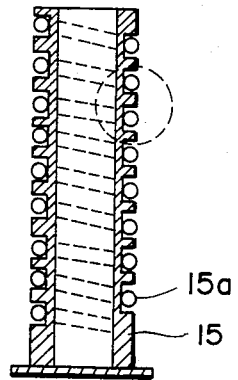
FIG. 8A shows schematically a cross-sectional view of a heater for the vacuum apparatus prior to the Al flame spraying treatment constructed so as to heat a cylindrical substrate from the inside thereof.
Figure 8B:
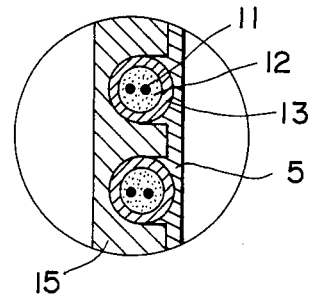
FIG. 8B shows schematically an enlarged cross-sectional view of the portion encircled with the broken line of the heater shown in FIG. 8A treated by the Al flame spraying.

FIG. 8A shows schematically a cross-sectional view of a heater for the vacuum apparatus prior to the Al flame spraying treatment constructed so as to heat a cylindrical substrate (not shown in a figure) from the inside thereof, and FIG. 8B shows schematically a enlarged cross-sectional view of the portion encircled with the broken line of the heater shown in FIG. 8A treated by the Al flame spraying.

The support of the heater for the vacuum apparatus shown in FIG. 8 has the spiral groove 15a of 3.2 mm in depth for setting the protecting tube 13. After tube 13 was wound and fixed in the groove 15a, the aluminum plasma flame spraying was performed similarly to the example shown in FIG. 6 to manufacture the heater for the vacuum apparatus having the aluminum film thereon.

The flame spraying film 5 formed by the aluminum flame spraying was deposited so as to become thicker as compared with the case of the example shown in FIG. 6. Then, the unevenness of the surface thereof was made smooth by grinding. The film thickness from the bottom of the groove 15a of the support for the heater to the surface of the film was 4.2 mm and the film thickness from the most outside surface of the support for the heater to the surface of the film was 1 mm.

Since, for example, the surface of the aluminum film formed on the heater for the vacuum apparatus shown in FIG. 8 does not have the hollows which fine powders of polysilane generated during the vapor deposition of amorphous silicon enter, the fine powders of polysilane can be easily removed by etching as compared with the case where the surface has the hollows.

The film formed on the surface of the heater for the vacuum apparatus described above is required to function sufficiently as the protecting film. Thus, it is desired that the thickness of the film is some tens of microns or more. Further, with regard to the cost of the formation and the thermal conductivity, it is desired that a thickness of the film is preferably 10 mm of less.

In summary, the thickness of the film is more desirably from 200 $\mu$m to 2 mm.

The film according to the present invention adheres strongly to the surface of the construction material for the vacuum apparatus. Thus, the film is excellent in durability, and particularly, is useful in the case where the film is formed on the surface of the heater for the vacuum apparatus requiring thermal stability.

Since the heater for the vacuum apparatus itself is heated, it has a problem that the releasing quantity of gas released from the surface thereof easily becomes larger than that from the surface of other construction materials. However, the problem can be easily settled by the present invention.

As described in detail above, by performing the simple treatment, according to the present invention, that is, the formation of the film on the surface of the construction material for the vacuum apparatus by the flame spraying method, the quantity of gas released from the surface thereof can be decreased to a great extent without obstructing the manufacture and performance of the conventional vacuum apparatus.

Also, in the case of the vacuum apparatus for etching in which a fluorine compound gas is used, corrosion resistance of the construction material for the vacuum apparatus to the etching gas can be easily improved according to the present invention.

Further, since the film according to the present invention can be formed at atmospheric pressure, the present invention can be carried out very easily.

In addition to the above, the low cost treatment method according to the present invention can be applied for improving the performance of the conventional apparatus.

What I claim is:

1. A method for treating the surface of an element subject to vacuum in a vacuum apparatus having a chamber for forming and etching a deposition film on a substrate to be treated, which comprises forming a film on the surface of the element by a flame spraying method.

2. A method according to claim 1, wherein said construction material is composed of steel.

3. A method according to claim 2, wherein said steel is stainless steel.

4. A method according to claim 1, wherein said film is composed of aluminum.

5. A method according to claim 1, wherein said film is composed of an oxide of aluminum.

6. A method according to claim 1, wherein said film is composed of an oxide of silicon.

7. A method according to claim 1, wherein the surface of the element of the vacuum apparatus is subjected to a blast treatment prior to the formation of the film by said flame spraying method.

8. An element subject to vacuum in a vacuum apparatus having a chamber for forming and etching a deposition film on a substrate to be treated, characterized in that a film is formed on the surface of said element by a flame spraying method.

9. An element according to claim 8, wherein the surface of said element is composed of steel.

10. An element according to claim 9, wherein said steel is stainless steel.

11. An element according to claim 8, wherein said film is composed of aluminum.

12. An element according to claim 8, wherein said film is composed of an oxide of aluminum.

13. An element according to claim 8, wherein said film is composed of an oxide of silicon.

14. An element according to claim 8, wherein the surface of said element is uneven.

15. An element according to claim 8, wherein said element is heater for the vacuum apparatus used under vacuum atmosphere.

16. An element according to claim 15, wherein said heater has a heating wire and a protecting tube for supporting and protecting said heating wire.

17. An element according to claim 16, wherein said heating wire is composed of nichrome.

18. An element according to claim 16, wherein said protecting tube is composed of steel.

19. An element according to claim 18, wherein said steel is stainless steel.

20. An element according to claim 16, wherein said heater has further insulating powders between said heating wire and protecting tube.

21. An element according to claim 20, wherein said insulating powder is composed of magnesia.

22. An element according to claim 20, wherein said heater has further a support for the heater for winding the protecting tube.

23. An element according to claim 22, wherein said support for the heater is composed of steel.

24. An element according to claim 23, wherein said steel is stainless steel.

25. An element according to claim 22, wherein said support for the heater has a spiral groove.

26. An element according to claim 8, wherein said element is a cathode used under vacuum atmosphere.

27. An element according to claim 8, wherein said element is a substrate holder used under vacuum atmosphere.

28. An element according to claim 8, wherein said element is a rotative mechanism of the substrate holder used under vacuum atmosphere.

29. An element according to claim 8, wherein said element is a gas-releasing pipe used under vacuum atmosphere.

30. An element according to claim 8, wherein said element is a baffle plate used under vacuum atmosphere.

31. An element according to claim 8, wherein said element is a shield plate used under vacuum atmosphere.

32. A vacuum treatment apparatus which has the element for the vacuum apparatus of claim 8.

* * * * *

UNITED STATES PATENT AND TRADEMARK OFFICE
CERTIFICATE OF CORRECTION

PATENT NO. : 4,732,792  
DATED : March 22, 1988  
INVENTOR(S) : YASUTOMO FUJIYAMA Page 1 of 2

It is certified that error appears in the above-identified patent and that said Letters Patent is hereby corrected as shown below:

COLUMN 4

Line 40, "still," should read --steel,--.

COLUMN 6

Line 38, "absorbed" should read --adsorbed--.
    Line 42, "of absorbed" should read --adsorbed--.
    Line 57, "ab-" should read --ad---.

COLUMN 7

Line 34, "absorbed" should read --adsorbed--.

COLUMN 8

Line 16, "tube 3." should read --tube 13.--.

COLUMN 9

Line 42, "A" should read --(a)--.
    Line 44, "B" should read --(b)--.
    Line 57, "absorbed" should read --adsorbed--.

COLUMN 10

Line 56, "of less." should read --or less.--.

UNITED STATES PATENT AND TRADEMARK OFFICE
CERTIFICATE OF CORRECTION

PATENT NO. : 4,732,792
DATED : March 22, 1988
INVENTOR(S) : YASUTOMO FUJIYAMA

It is certified that error appears in the above-identified patent and that said Letters Patent is hereby corrected as shown below:

<u>COLUMN 11</u>

Lines 30-31, "construction material" should read --element--.

<u>COLUMN 12</u>

Line 10, "heater" should read --a heater--.

Signed and Sealed this

Fourth Day of October, 1988

Attest:

DONALD J. QUIGG

Attesting Officer     Commissioner of Patents and Trademarks